Sept. 10, 1963 W. D. FULLER 3,103,642

STRUCTURALLY INTEGRATED FILM ELECTRONIC ASSEMBLIES

Filed Aug. 17, 1960 3 Sheets-Sheet 1

INVENTOR.
WILLIAM D. FULLER
BY George A. Sullivan
Agent

STRUCTURALLY INTEGRATED FILM ELECTRONIC ASSEMBLIES

Filed Aug. 17, 1960 3 Sheets-Sheet 2

INVENTOR.
WILLIAM D. FULLER
BY George Sullivan
Agent

INVENTOR.
WILLIAM D. FULLER
BY
George Sullivan
Agent

3,103,642
STRUCTURALLY INTEGRATED FILM ELECTRONIC ASSEMBLIES

William D. Fuller, Palo Alto, Calif., assignor to Lockheed Aircraft Corporation, Burbank, Calif.
Filed Aug. 17, 1960, Ser. No. 50,282
3 Claims. (Cl. 338—87)

This invention relates generally to the fabrication and construction of electronic components, and more particularly to new types of structurally integrated film electronic assemblies and methods of fabrication thereof.

It is the broad object of this invention to provide improved means and methods of microminiaturizing electronic circuitry.

A more specific object of this invention is to provide new types of structurally integrated film electronic components which can be simply and economically fabricated by means of automatic or semi-automatic production techniques.

Another object of this invention is to provide a high value structurally integrated film resistor and a structurally integrated inductor which can be simply and economically fabricated.

A further object of this invention is to provide structurally integrated variable resistor and inductor components for microminiaturization applications.

In a typical embodiment of the invention the above objects are realized by coating the interior surface of a threaded hole provided in a suitable insulative substrate with a thin layer of metal. The threaded hole is then reamed so that the crests of the thread are removed to a sufficient depth to interrupt the metal film thereon, the roots of the thread remaining metallized to form a continuous spiral film. This metal spiral film may then serve as an inductor or may be converted to a high resistance to serve as a resistor.

The specific nature of the invention as well as other objects, uses and advantages thereof will clearly appear from the following description and the accompanying drawing in which.

Like numerals designate like elements throughout the figures of the drawing.

Figure 1:
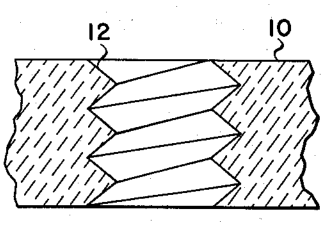
FIGS. 1–3 are cross-sectional views illustrating various steps in the fabrication of a metallized spiral in a threaded hole of a substrate, in accordance with the invention.
Figure 2:
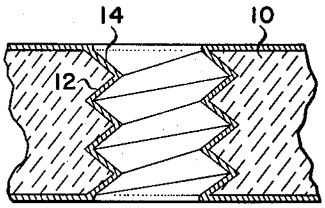
Figures 3, 4, 5:
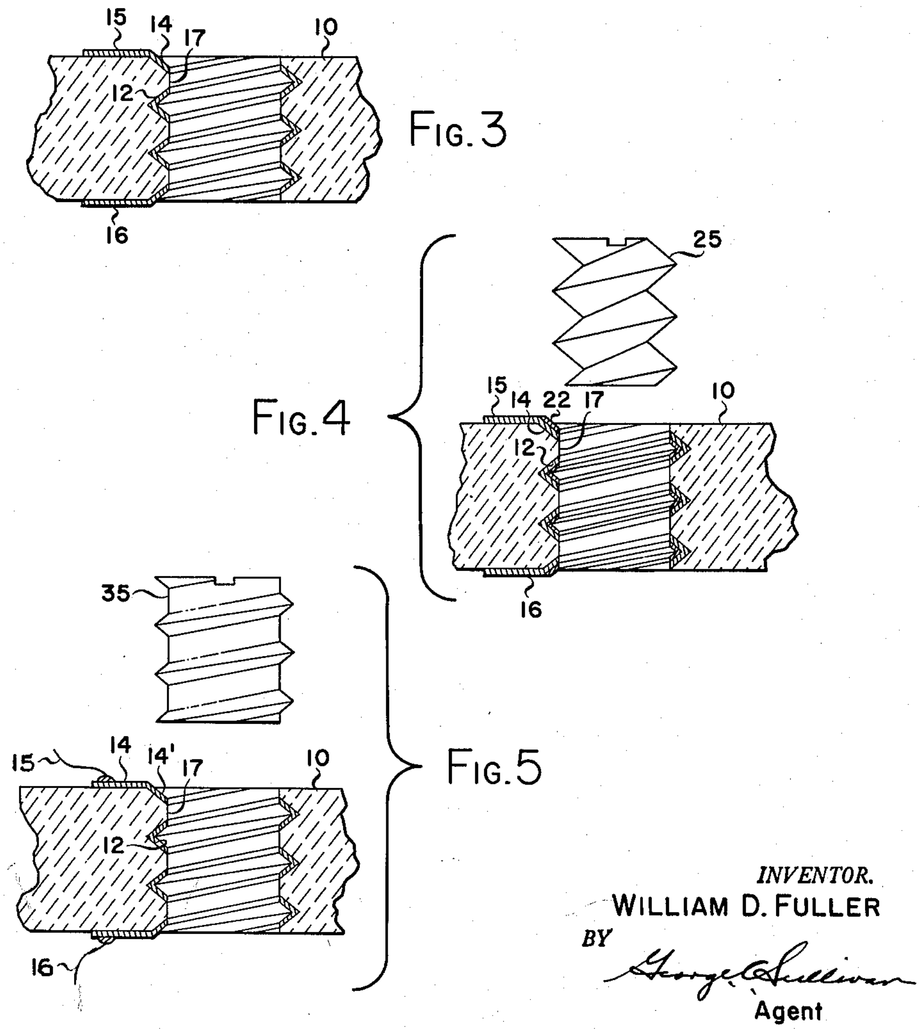
FIG. 4 is a cross-sectional view of an embodiment of a structurally integrated film inductor and its associated core, in accordance with the invention.
FIG. 5 is a cross-sectional view of an embodiment of a structurally integrated film resistor and its associated variable element, in accordance with the invention.

In FIGS. 1–3, a threaded hole 12 is provided in a portion of a suitable substrate 10, which may be any of a variety of suitable materials such as fused silica, quartz, glass, alumina or magnesium oxide. The substrate 10 including the threaded hole 12 is then coated with a film of titanium 14 as shown in FIG. 2. This coating may be accomplished by a method such as is disclosed in U.S. Patent No. 2,746,888. However, I prefer to use the sandwich method disclosed in the commonly assigned copending patent applications Serial Numbers 8,157, now Patent No. 3,022,201 and 8,481, now Patent No. 2,991,195, both filed on February 11, 1960. Obviously any number of threaded holes in the substrate 10 could be simultaneously coated along with the threaded hole 12.

The flat faces of the substrate 10 and any other surfaces thereof may now be etched using well known etchants and paint resists to providee any desired titanium wiring patterns thereon, as indicated at 15 and 16 in FIG. 3, the excess titanium being etched away.

The titanium-coated threaded hole 12 is now reamed so that the crests of the thread are removed to a sufficient depth to interrupt the titanium film thereon, as shown in FIG. 3. The titanium film remaining in the roots of the thread then forms a continuous spiral film extending from one end of the hole 12 to the other. The spiral film so formed may then serve as an inductor having connection points 15 and 16, the value of the inductor being determined by the geometry of the threaded hole 12 and the type of thread provided.

Obviously, any network of series and parallel inductors could be provided in the substrate 10 by using one threaded hole for each inductor and forming the inductors as just described, and the wiring patterns on the faces of the substrate 10 could be etched to provide a desired interconnection pattern therebetween. It is also obvious that other metals besides titanium could be used for providing a metallized film on the thread and faces of the substrate. However, the use of titanium is advantageous in that other types of components are more easily fabricated from an initial titanium film and all such components could then be subjected to this initial titanium coating step without the need of a special coating step for the inductors.

While titanium is a relatively low resistivity metal, it may be desirable in order to reduce R.-F. resistance losses to electroplate the titanium spiral with a film of very low resistivity metal such as gold or silver. Such an electroplated film is illustrated at 22 in FIG. 4.

If a large value inductor or variable inductor is desired, a threaded magnetic core 25 as shown in FIG. 4 having threads matching the threaded hole 12 may be provided and inserted into the threaded hole 12, thereby serving as a movable core of the spiral film to permit variation of the spiral inductance. Obviously, the use of a magnetic core such as 25 permits a much higher inductance to be obtained.

It is also possible to derive a high value resistor from the titanium spiral film obtained in the embodiment of FIG. 3. This is accomplished by converting the titanium spiral film into a spiral film of high resistivity. A method which has been found well suited for achieving this conversion is disclosed in the commonly assigned copending patent application Serial Number 8,480, filed February 11, 1960. The method disclosed in this copending patent application involves converting a titanium film into a high resistivity film by simultaneously anodizing and etching the film in a bath essentially consisting of an anodizing electrolyte and etching material capable of etching the metal oxide formed on the titanium film as a result of anodization thereof. The concentration of etching material in the bath is chosen so that the surface of the film is converted into oxide by anodization before being attacked by the etching material, the time of simultaneous anodizing and etching of the film in the bath determining the resultant resistivity thereof.

It has been discovered that this simultaneous anodizing and etching treatment achieves an amazingly uniform and more controlled reduction in the film than could be obtained by any known etching process, thereby making it possible to obtain very thin films of high resistivity and stability. An additional advantage which is also derived is that the resistivity of the film increases not only because of the reduction in its thickness, but also, because when the film becomes very thin the anodization process will have converted a significant thickness of the film into a high resistance metal oxide.

In a preferred embodiment of this simultaneous anodizing and etching technique, a two-bath treatment is provided in which the first bath performs the simultaneous anodizing and etching of the film as described above until an intermediate resistivity is obtained; then the final value of resistivity is obtained in a true anodizing bath without any etching material. This second bath is chosen so that the anodizing process penetrates to a greater depth than did the anodizing process of the first bath, thereby causing a greater portion of the film to be converted into oxide to increase the film resistivity. Using this greater depth of anodizing in the second bath without etching permits greater uniformity and more control of the final resistivity obtained without further thinning of the film and, in addition, permits a higher resistivity to be obtained for a greater film thickness, since more of the film is converted into a high resistance oxide.

The wiring pattern on the faces of the substrate 10, such is indicated at 15 and 16, may be covered with a protective paint or epoxy resist for protection during the above described conversion treatment. The resulting converted spiral film 14' is shown in FIG. 5, the converted film 14' being shown cross-hatched for illustrative purposes.

It will now be evident that between the portions 15 and 16 in FIG. 5 a high value resistor will appear which may suitably be connected to other components of the substrate by means of the interconnection patterns on the faces thereof, the value of the resistor depending upon the resistivity and length of the spiral film. If a variable resistor is desired a metal shorting screw 35 such as shown in FIG. 5 may be threaded in the threaded hole 12. As the shorting screw 35 is turned in the hole 12, the number of turns of the spiral film which are shorted thereby varies, varying the resistance of the spiral film appearing between the wiring pattern portions 15 and 16. Instead of being a metal screw, the screw 35 might be a screw of refractory material having all or a portion of its threads coated with a conductive material.

Figure 6:
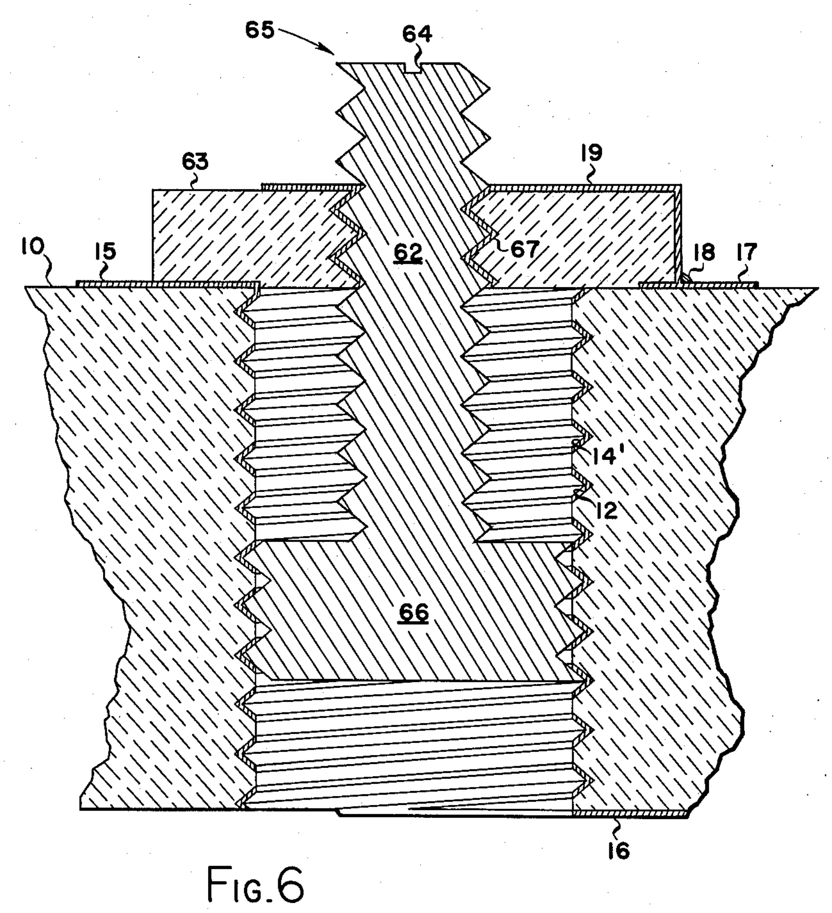
FIG. 6 is a cross-sectional view of a structurally integrated potentiometer, in accordance with the invention.

Also, instead of inserting the metal screw 35 shown in FIG. 5, a metal potentiometer screw 65 could be inserted in the threaded hole 12 as shown in FIG. 6. The potentiometer screw 65 has a disc portion 66 which turns in the thread of the hole 12 and a reduced threaded portion 62 extending up out of the hole 12 and having a groove 64 for turning purposes.

Figure 7:
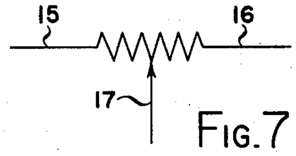
FIG. 7 is an electrical diagram representing the potentiometer of FIG. 6.

An insulative disc 63 is suitably mounted over the threaded hole 12 in the substrate 10 and provided with a metal coated internal thread 67 through which the reduced portion 62 of the potentiometer screw 65 is threaded. The insulative disc 63 is also provided with a metal film 19 which can simultaneously be formed along with the coated thread 67 to permit the metal potentiometer screw to be electrically connected to a portion 17 of the wiring pattern on a face of the substrate 10 by soldering as indicated at 18. Thus, the portion 17 is electrically connected to the variable arm of the resulting potentiometer and the portions 15 and 16 are electrically connected to the ends of the potentiometer as shown in the schematic diagram of FIG. 7.

Figures 8, 9:
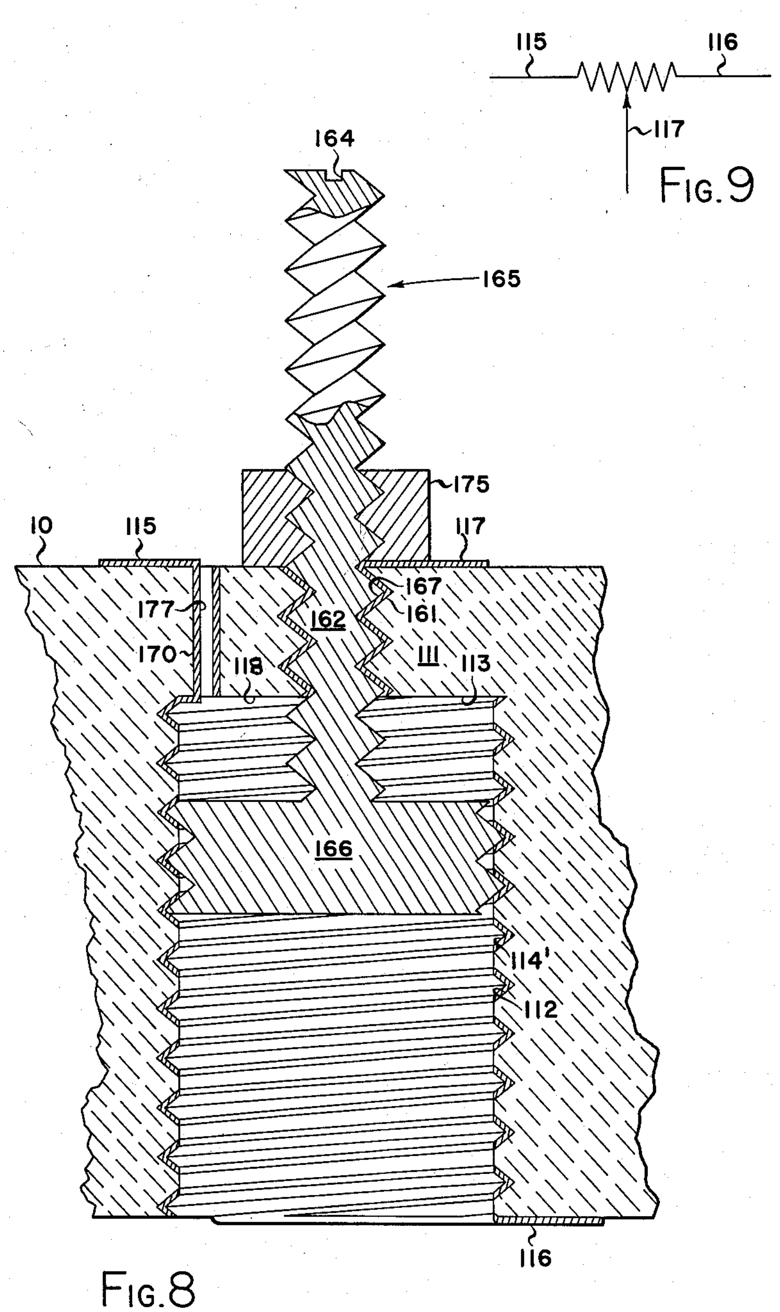
FIG. 8 is a cross-sectional view of another embodiment of a structurally integrated potentiometer in accordance with the invention.
FIG. 9 is an electrical diagram representing the potentiometer of FIG. 8.

Another version of a structurally integrated potentiometer in accordance with the invention is shown in FIG. 8. In this version, the threaded hole 112 goes through only the greater portion of the substrate 10 leaving a remaining substrate portion 111 in which a concentric threaded hole 161 of reduced diameter is provided. In addition, an even smaller hole 170 is provided in the substrate portion 111 on one side of the threaded hole 161 in order to provide communication between the cavity of the threaded hole 112 in the substrate 10 and the top face thereof.

The surfaces of the substrate 10 with its holes 112, 161 and 170 are now coated with titanium as described in connection with FIGS. 1–3 and the faces of the substrate 10 are etched to provide interconnection portions 115, 116 and 117 as shown in FIG. 8. Also portions 113 and 118 at the bottom of the threaded hole 112 are etched to provide electrical insulation between the film 167 of the threaded hole 161 and the film on the threaded hole 112 as shown. The threaded hole 112 is now reamed as described previously to form a spiral film therein. One end of the spiral film is continued to the interconnection pattern portion 116 on the bottom face of the substrate 10 to make electrical connection thereto, while the other end of the spiral film makes electrical connection to the portion 115 on the top face of the substrate 10 by means of the metal film 177 formed in the hole 170 during the coating process.

The spiral film in the threaded hole 112 is now converted to a high resistivity (as indicated by the double cross-hatching in FIG. 8) by the previously described simultaneous anodizing and etching method described in the aforementioned commonly assigned copending patent application. Film surfaces which are to remain at low resistivities may be protected by a suitable paint resist or epoxy.

A metal potentiometer screw 165 is now provided having a threaded disc portion 166 threaded in the threaded hole 112 and a reduced threaded portion 162 threaded in the metal coated threaded hole 161. A nut 175 is threaded on the portion 162 and may be tightened against the top face of the substrate 10 to hold the potentiometer screw 165 in a locked position. The metal portion 117 thus makes electrical connection to the variable potentiometer screw 165 by means of the contacting threads of the portion 111 and the reduced portion 162, and the portions 115 and 116 make electrical connection to opposite ends of the spiral film, the resulting electrical diagram thereby being that illustrated in FIG. 9.

In the embodiments and methods described herein, it will be noted that titanium has been used as the basic material from which the resultant structurally integrated assembly is fabricated. It is to be understood, that the invention is not limited to the use of titanium or to the specific arrangements and techniques described herein. Other materials and other techniques and arrangements could also be employed by means of which a high resistivity film can be provided on the interior surfaces of one or more holes in a substrate with interconnection patterns therebetween.

However, the use of titanium as described is advantageous in that it is stable at very high temperatures and the conversion treatment for obtaining a high resistivity film therefrom disclosed in the aforementioned commonly assigned copending patent application results in stable films of high resistivity. This conversion treatment may also be successfully employed with zirconium, hafnium and uranium as well as titanium.

The above modifications and variations indicated above are not exhaustive and the invention is to be considered as considered as including all possible modfications and variations in the construction, arrangement and fabrication procedure coming within the scope of the invention as defined in the appended claims.

I claim as my invention:

1. A structurally integrated potentiometer comprising an insulative substrate having a threaded hole therein, a resistive film in the roots of said hole forming a spiral resistive film, a potentiometer screw in said hole having a first conductive disc portion threaded in the threads of said hole and a second threaded portion of reduced diameter depending from said first portion and having means adapted to permit rotation thereof and for locking said screw in position, and means providing electrical connections to the ends of said spiral film and to said potentiometer screw.

2. A structurally integrated potentiometer comprising an insulative substrate having an aperture therein passing through said substrate, said aperture having first and second threaded hole portions, said first hole portion extending from one face of said substrate almost to the other face thereof, a resistive film in the roots of said hole forming a spiral resistive film, said second hole portion being concentric with said first hole portion and of reduced diameter with respect thereto and extending from the first hole portion to said other face, a conductive film coated on the inner surface of said second hole portion and electrically insulated from said spiral resistive film, and a potentiometer screw in said aperture having a first conductive disc portion threaded in said first threaded hole portion and a second conductive portion of reduced diameter depending from said first portion and threaded in said second hole portion and passing therethrough beyond said other face, a first conductive portion on said other face of said substrate, a conductive film on said substrate electrically connecting said first conductive portion and the conductive film coated on the inner surface of said second hole portion, means including a metal film on the inner surface of a hole between the end of said first hole portion and said other face for electrically connecting said second film portion and the end of said spiral film nearest said other face, and a conductive film portion on said one face of said substrate electrically connected to the nearest end of said spiral resistive film.

3. The invention in accordance with claim 2 wherein a first conductive film portion is provided on said other face of the substrate and located so as to make electrical contact with the film on the inner surface of said second hole portion, wherein a metal coated hole is provided in the substrate communicating with said other face and said first hole portion, wherein a second conductive portion is provided on said other face and located so as to make electrical contact with the nearest end of said spiral resistive film by means of said metal coated hole, and wherein a third conductive film is provided on said one face of the substrate and located so as to make electrical contact with the other end of said spiral resistive film.

References Cited in the file of this patent

UNITED STATES PATENTS

| | | |
|---|---|---|
| 1,388,373 | Richtmyer | Aug. 23, 1921 |
| 1,586,240 | Cope | Mar. 25, 1926 |
| 1,832,466 | Means | Nov. 17, 1931 |
| 1,904,208 | Dow | Apr. 18, 1933 |
| 2,484,117 | Payne | Oct. 11, 1949 |
| 2,792,620 | Kohring | May 21, 1957 |
| 2,827,536 | Moore et al. | Mar. 18, 1958 |
| 2,917,814 | Ruckelshaus | Dec. 22, 1959 |